United States Patent
Yamagata et al.

(10) Patent No.: US 7,276,407 B2
(45) Date of Patent: Oct. 2, 2007

(54) METHOD FOR FABRICATING SEMICONDUCTOR DEVICE

(75) Inventors: Satoru Yamagata, Fukuyama (JP); Masayuki Hirata, Higashihiroshima (JP); Shinichi Sato, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/227,224

(22) Filed: Sep. 16, 2005

(65) Prior Publication Data

US 2006/0063316 A1 Mar. 23, 2006

(30) Foreign Application Priority Data

Sep. 17, 2004 (JP) .............................. 2004-271639

(51) Int. Cl.
*H01L 21/8238* (2006.01)
(52) U.S. Cl. ..................... 438/199; 438/231; 438/232; 438/283
(58) Field of Classification Search ........ 438/199–201, 438/231, 232, 283, 305, 306
See application file for complete search history.

(56) References Cited

U.S. PATENT DOCUMENTS 6,287,912 B1 * 9/2001 Asakura et al. ............. 438/241

FOREIGN PATENT DOCUMENTS

| JP | 06-283675 | 10/1994 |
| JP | P2000-77635 A * | 3/2000 |

* cited by examiner

*Primary Examiner*—Hsien-Ming Lee
(74) *Attorney, Agent, or Firm*—Harness, Dickey & Pierce, P.L.C.

(57) ABSTRACT

A method for fabricating a semiconductor device including on a single semiconductor substrate, a first MOS transistor having a first gate insulating film of a predetermined thickness, and second and third MOS transistors sharing a second gate insulating film smaller in thickness than the first gate insulating film, the third MOS transistor being lower in threshold voltage than the second MOS transistor, the method includes the steps of: adjusting the threshold voltages of the first and third MOS transistors by first ion-implantation; and adjusting the threshold voltage of the second MOS transistor by second ion-implantation, the second ion-implantation being performed under implantation conditions different from those of the first ion-implantation.

8 Claims, 4 Drawing Sheets

METHOD FOR FABRICATING SEMICONDUCTOR DEVICE

CROSS-REFERENCE TO RELATED APPLICATION

This application is related to Japanese Patent Application No. 2004-271639 filed on Sep. 17, 2004, whose priory is claimed and the disclosure of which is incorporated by reference in its entirety.

BACKGROUND OF THE INVENTION

1. Field of the Invention

The present invention relates to a method for fabricating a semiconductor device.

2. Description of Related Art

Conventionally, in LSIs, a MOS transistor having a thick gate insulating film for high voltage and a MOS transistor having a thin gate insulating film for low voltage have been formed. In recent years, there has been an increasing trend toward using a lower supply voltage in the LSIs. Where the supply voltage is 1.8 V, for example, the difference is small between the supply voltage and a typically used threshold voltage of about 0.6 V. Therefore, in the case of differential amplifier circuits, for example, circuits that stably operate at low supply voltage cannot be formed without transistors having a low threshold voltage.

However, it is not possible to reduce the threshold voltage of all transistors, because the leakage current of the MOS transistors increases as the threshold voltage decreases. For this reason, it is preferable that only part of the MOS transistors for low voltage has a low threshold voltage.

For the fabrication of MOS transistors having two types of threshold voltages (i.e., high threshold voltage and low threshold voltage) in a single semiconductor substrate, there is known a method in which an ion-implantation step for adjusting the threshold voltage is added. However, this method has a problem that the number of steps for photolithography and ion-implantation increases in the fabrication process.

Japanese Unexamined Patent Publication No. HEI 06(1994)-283675 discloses a method in which a region for forming a transistor having a low threshold voltage is covered with a resist at the time of ion-implantation for well formation, so that a low impurity concentration region is formed under the covered region. In this method, wells are formed by oblique implantation, and adjustment of the threshold voltage of the transistor having a low threshold voltage is also performed by oblique implantation.

In this method, it is difficult to control the impurity concentration near the surface of a semiconductor substrate. Therefore, the threshold voltage of the transistor having a low threshold voltage tends to vary widely.

SUMMARY OF THE INVENTION

The present invention has been made in view of the above circumstances, and it provides a simple method for fabricating three types of MOS transistors which are different in thickness of gate insulating film or threshold voltage on a single semiconductor substrate.

According to the present invention, provided is a method for fabricating a semiconductor device comprising on a single semiconductor substrate, a first MOS transistor having a first gate insulating film of a predetermined thickness, and second and third MOS transistors sharing a second gate insulating film smaller in thickness than the first gate insulating film, the third MOS transistor being lower in threshold voltage than the second MOS transistor, the method comprising the steps of: adjusting the threshold voltages of the first and third MOS transistors by first ion-implantation; and adjusting the threshold voltage of the second MOS transistor by second ion-implantation, the second ion-implantation being performed under implantation conditions different from those of the first ion-implantation.

According to the method of the present invention, the first ion-implantation for adjusting the threshold voltages of the first and third MOS transistors (which are different in thickness of the gate insulating film), and the second ion-implantation for adjusting the threshold voltage of the second MOS transistor are performed. Thus, the threshold voltages of three types of MOS transistors are adjusted by two ion-implantations, whereby the three types of MOS transistors which are different in thickness of gate insulating film or threshold voltage can be fabricated on a single semiconductor substrate by a simple method.

DESCRIPTION OF THE PREFERRED EMBODIMENTS

The present invention provides a method for fabricating a semiconductor device comprising on a single semiconductor substrate, a first MOS transistor having a first gate insulating film of a predetermined thickness, and second and third MOS transistors sharing a second gate insulating film smaller in thickness than the first gate insulating film, the third MOS transistor being lower in threshold voltage than the second MOS transistor, the method comprising the steps of: adjusting the threshold voltages of the first and third MOS transistors by first ion-implantation; and adjusting the threshold voltage of the second MOS transistor by second ion-implantation, the second ion-implantation being performed under implantation conditions different from those of the first ion-implantation.

Specifically, this method can be performed by a method comprising the steps of: adjusting the threshold voltages of first and third MOS transistors while forming first and third MOS transistor formation regions in a semiconductor substrate by first ion-implantation; forming a first gate insulating film having a predetermined thickness on the entire surface of the substrate; adjusting the threshold voltage of a second MOS transistor while forming a second MOS transistor formation region in the substrate by second ion-implantation, the second ion-implantation being performed under different implantation conditions from those of the first ion-implantation; exposing the substrate by removing a portion of the first gate insulating film above the second and third MOS transistors formation regions; and forming a second gate insulating film on the exposed portion of the substrate so that the second gate insulating film is smaller in thickness than the first gate insulating film.

The present invention will hereinafter be described by way of an embodiment thereof. The steps described in this embodiment are not necessarily performed in the aforementioned order, and the order of steps may be changed as long as these steps can be carried out. It should be understood that methods with steps in different orders are also included in the scope of the present invention. For example, the second ion-implantation may be performed before the formation of the first gate insulating film.

1. First Ion-Implantation Step

In this step, the threshold voltages of the first and third MOS transistors is adjusted while the first and third MOS transistor formation regions are formed in the semiconductor substrate by the first ion-implantation.

Figure 2:
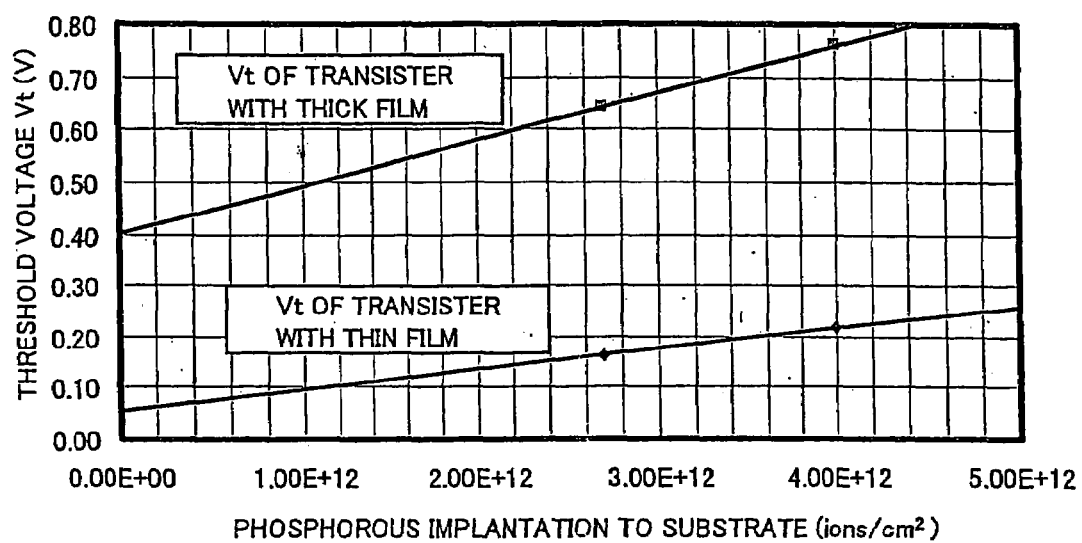
FIG. 2 is a graph illustrating the relationship between the impurity implantation dose into a substrate for threshold voltage adjustment and the threshold voltage of a PMOS transistor (energy: 40 KeV), according to the present invention.

The term "semiconductor substrate" includes an elementary semiconductor substrate such as silicon or a compound semiconductor substrate such as GaAs. The first and third MOS transistor formation regions can be formed by, for example, forming on the substrate a resist layer having openings for the first and third MOS transistor formation, and performing ion-implantation using the resist layer as a mask. The MOS transistors are NMOS or PMOS transistors, and all of the first to third MOS transistors are usually of the same type. The implantation conditions such as ion-implantation energy, dose or angle may be appropriately set in accordance with the purpose. The ion-implantation may be performed in a single step, but is preferably performed in a plurality of steps under different implantation conditions. FIG. 2 illustrates a graph showing the relationship between the ion-implantation dose and the threshold voltages of two types of PMOS transistors having different gate insulating film thicknesses. As is apparent from the figure, the threshold voltage increases as the implantation dose or the thickness of the gate insulating film increases. Therefore, it is understood that the threshold voltage can be adjusted by changing the ion-implantation conditions. Though FIG. 2 is a graph showing the data of PMOS transistors, the same applies to the NMOS transistors.

2. First Gate Insulating Film Formation Step

In this step, the first gate insulating film of a predetermined thickness is formed on the entire surface of the substrate.

The gate insulating film is formed of a silicon oxide film or a film resulting from nitridation of a silicon oxide film after the formation thereof. The silicon oxide film may be formed by thermal oxidation of the substrate, or by a CVD method or the like. As described above, this step may be performed after the second ion-implantation.

3. Second Ion-Implantation Step

In this step, the threshold voltage of the second MOS transistor is adjusted while the second MOS transistor formation region is formed in the semiconductor substrate by the second ion-implantation under implantation conditions different from those of the first ion-implantation.

The second MOS transistor formation region may be formed by, for example, forming on the substrate a resist layer having an opening for the second MOS transistor formation and performing ion-implantation using the resist layer as a mask. The second ion-implantation is performed under implantation conditions different from those of the first ion-implantation. By the term "implantation conditions" used herein, the ion-implantation energy, dose, angle or the like is meant.

4. Substrate Exposing Step

In this step, the substrate is exposed by removing a portion of the first gate insulating film above the second and third MOS transistor formation regions.

This step may be carried out by, for example, forming a resist layer above the first MOS transistor formation region and removing the first gate insulating film using the resist layer as a mask, by etching with a hydrofluoric acid or the like.

5. Second Gate Insulating Film Formation Step

In this step, the second gate insulating film is formed on the exposed portion of the substrate so that the second gate insulating film is smaller in thickness than the first gate insulating film.

The second gate insulating film is formed of a silicon oxide film or a film resulting from nitridation of a silicon oxide film after the formation thereof. The silicon oxide film may be formed by thermal oxidation of the substrate, or by a CVD method or the like. The thickness of the first gate insulating film usually changes when the second gate insulating film is formed. The thickness of the first gate insulating film after the formation of the second gate insulating film is preferably 10 nm to 16 nm, and the thickness of the second gate insulating film is preferably 3 nm to 6 nm.

Thus, according to the present invention, a semiconductor device including MOS transistors having gate insulating films with two types of thicknesses can be fabricated by a simple method. The forming method of the gate insulating films is not limited to the method described above, and any method may be employed as long as the gate insulating films having two types of thicknesses can be obtained and the first gate insulating film is greater in thickness than the second gate insulating film in the end.

In the semiconductor device fabricated by the aforementioned steps, the first and third MOS transistors preferably have threshold voltages of 0.5 V to 0.8 V and 0.05 V to 0.2 V, respectively. Thus, according to the present invention, a semiconductor device including transistors having different threshold voltages can be fabricated by a small number of steps.

The third MOS transistor is preferably greater in gate length than the second MOS transistor. With this construction, an increase in leakage current of the third MOS transistor can be suppressed even when the threshold voltage of the third MOS transistor is lower than that of the second MOS transistor.

EXAMPLE 1

Figure 1A:
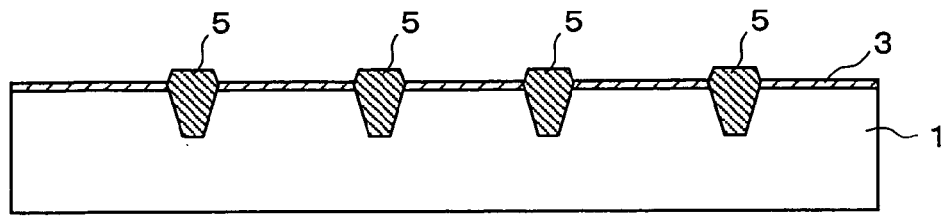
FIG. 1A to FIG. 1D are cross-sectional views illustrating fabrication steps of a semiconductor device according to a first example of the present invention.

A fabrication method of a semiconductor device according to the first Example of the invention will hereinafter be described with reference to FIGS. 1A to FIG. 1K. As shown in FIG. 1A, STIs (Shallow Trench Isolations) 5 for isolating elements are formed in a p-type semiconductor substrate 1 by a well-known technique, and a first sacrificial oxide film 3 having a thickness of 10 nm to 20 nm is formed on the substrate by thermal oxidation.

Figure 1B:
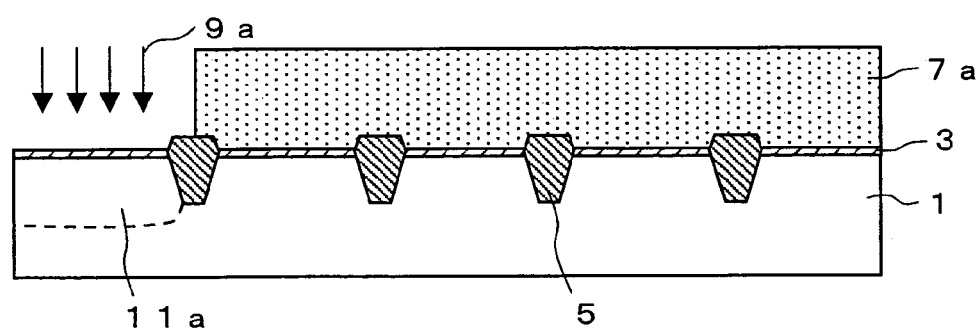

Subsequently, as shown in FIG. 1B, the threshold voltage of a first NMOS transistor is adjusted while a first NMOS transistor formation region 11a is formed by first ion-implantation 9a of p-type impurities. More specifically, a resist is applied to the entire surface of the resultant substrate in a thickness of 2 μm to 4 μm, and a portion of the resist at a position where ions are to be implanted for the first NMOS transistor is exposed and developed to form a resist layer 7a having an opening in the exposed/developed portion. Then, using the resist layer 7a as a mask, p-type impurities, such as boron, are ion-implanted at an implantation energy of 350 KeV, an implantation dose of $4 \times 10^{12}$ ions/cm$^2$, and an implantation angle of 7° and further at an implantation energy of 150 KeV, an implantation dose of $5.5 \times 10^{12}$ ions/cm$^2$, and an implantation angle of 7° for the formation of the well (first NMOS transistor formation region) 11a. Next, p-type impurities, such as boron, are ion-implanted at an implantation energy of 20 KeV, an implantation dose of $3.0 \times 10^{12}$ ions/cm$^2$, and an implantation angle of 7° for the threshold voltage adjustment.

Figure 1C:
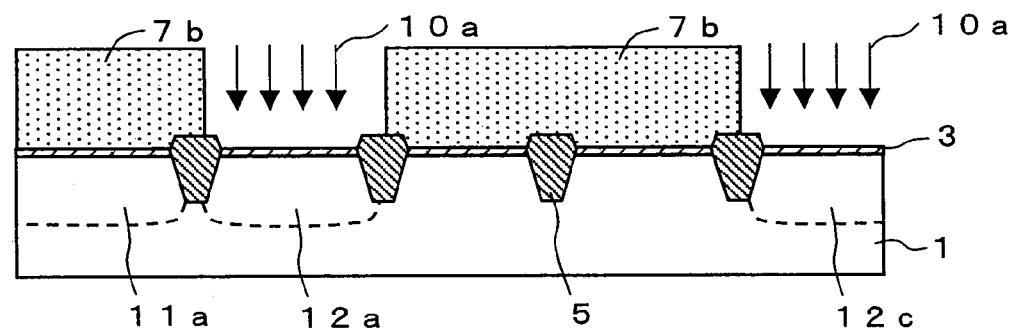

As shown in FIG. 1C, the threshold voltages of first and third PMOS transistors are adjusted while first and third PMOS transistor formation regions 12a and 12c are formed by first ion-implantation 10a of n-type impurities. More specifically, a resist is applied to the entire surface of the resultant substrate in a thickness of 2 μm to 4 μm, and portions of the resist at positions where ions are to be implanted for the first and third PMOS transistors are exposed and developed to form a resist layer 7b having openings in the exposed/developed portions, respectively. Then, using the resist layer 7b as a mask, n-type impurities, such as phosphorus, are ion-implanted at an implantation energy of 800 KeV, an implantation dose of $5 \times 10^{12}$ ions/cm$^2$, and an implantation angle of 7° and further at an implantation energy of 330 KeV, an implantation dose of $3 \times 10^{12}$ ions/cm$^2$, and an implantation angle of 7° for the formation of the wells (first and third PMOS transistor formation regions) 12a and 12c. Next, n-type impurities, such as phosphorus, are ion-implanted at an implantation energy of 40 KeV, an implantation dose of about $1.2 \times 10^{12}$ ions/cm$^2$ or about $1.0 \times 10^{12}$ ions/cm$^2$ to about $2.5 \times 10^{12}$ ions/cm$^2$, and an implantation angle of 7° for the threshold voltage adjustment.

Figure 1D:
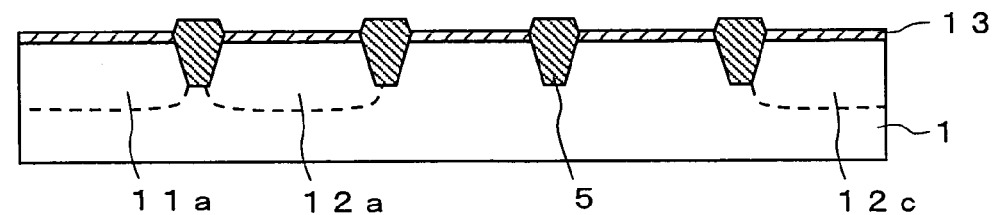

As shown in FIG. 1D, the sacrificial oxide film 3 on the entire surface of the substrate is removed using a 1% dilute hydrofluoric acid solution, and a first gate insulating film 13 having a thickness of about 8 nm is formed by thermal oxidation of the substrate 1. The thickness of the first gate insulating film 13 will further be increased to about 11 nm in a thermal oxidation step for the formation of a second gate insulating film 15 which will be described below.

Figure 1E:
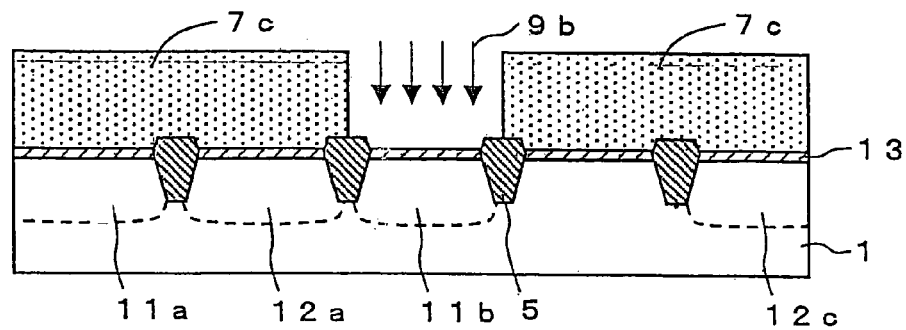
FIG. 1E to FIG. 1H are cross-sectional views illustrating fabrication steps of the semiconductor device according to the first example of the present invention.

As shown in FIG. 1E, the threshold voltage of a second NMOS transistor is adjusted while a second NMOS transistor formation region 11b is formed by second ion-implantation 9b of p-type impurities. More specifically, a resist is applied to the entire surface of the resultant substrate in a thickness of 2 μm to 4 μm, and a portion of the insulating film at a position where ions are to be implanted for the second NMOS transistor is exposed and developed to form a resist layer 7c having an opening in the exposed/developed portion. Then, using the resist layer 7c as a mask, p-type impurities, such as boron, are ion-implanted at an implantation energy of 200 KeV, an implantation dose of $7.6 \times 10^{12}$ ions/cm$^2$, and an implantation angle of 7° and further at an implantation energy of 100 KeV, an implantation dose of $1.0 \times 10^{13}$ ions/cm$^2$, and an implantation angle of 7° for the formation of the well (second NMOS transistor formation region) 11b. Next, p-type impurities, such as boron, are ion-implanted at an implantation energy of 20 KeV, an implantation dose of about $8.9 \times 10^{12}$ ions/cm$^2$, and an implantation angle of 7° for the threshold voltage adjustment.

Figure 1F:
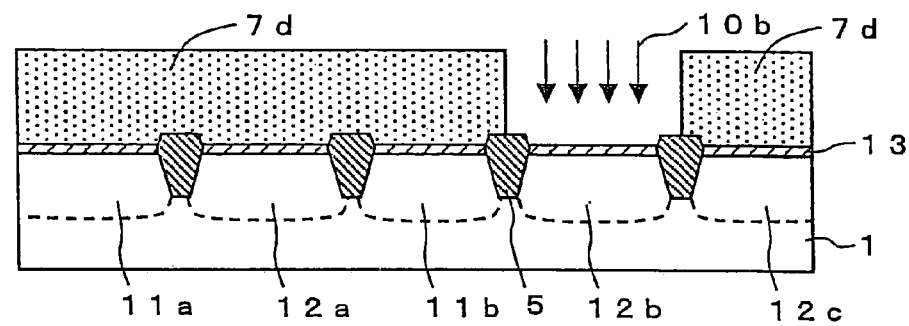

As shown in FIG. 1F, the threshold voltage of a second PMOS transistor is adjusted while a second PMOS transistor formation region 12b is formed by second ion-implantation 10b of n-type impurities. More specifically, a resist is applied to the entire surface of the resultant substrate in a thickness of 2 μm to 4 μm, and a portion of the resist at a position where ions are to be implanted for the second PMOS transistor is exposed and developed to form a resist layer 7d having an opening in the exposed/developed portion. Then, using the resist layer 7d as a mask, n-type impurities, such as phosphorus, are ion-implanted at an implantation energy of 530 KeV, an implantation dose of $1.5 \times 10^{13}$ ions/cm$^2$, and an implantation angle of 7° and further at an implantation energy of 240 KeV, an implantation dose of $3.9 \times 10^{12}$ ions/cm$^2$, and an implantation angle of 7° for the formation of the well (second PMOS transistor formation region) 12b. Next, n-type impurities, such as phosphorus, are ion-implanted at an implantation energy of 40 KeV, an implantation dose of $8.8 \times 10^{12}$ ions/cm$^2$, and an implantation angle of 7° for the threshold voltage adjustment.

Figure 1G:
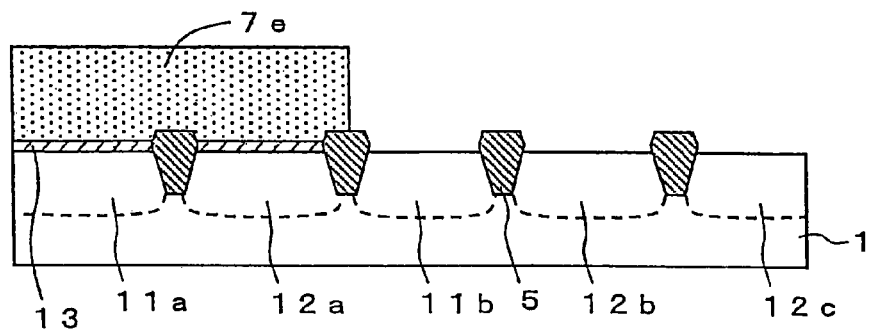

As shown in FIG. 1G, a portion of the first gate insulating film 13 above the second NMOS transistor formation region 11b and the second and third PMOS transistor formation regions 12b and 12c is removed to expose the substrate. More specifically, a resist is applied to the entire surface of the resultant substrate in a thickness of 2 μm, and a resist layer 7e having an opening above a removing portion of the first gate insulating film 13. Using the resist layer 7e as a mask, the first gate insulating film 13 is patterned with a 1% dilute hydrofluoric acid solution. Then, the resist layer 7e is removed.

Figure 1H:
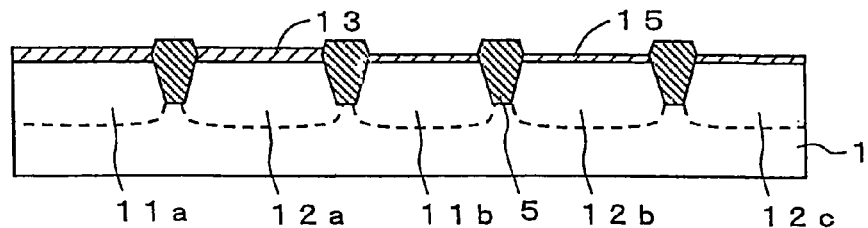

As shown in FIG. 1H, thermal oxidation of the substrate 1 is performed to form the second gate insulating film 15 having a thickness of 4 nm.

Figure 1I:
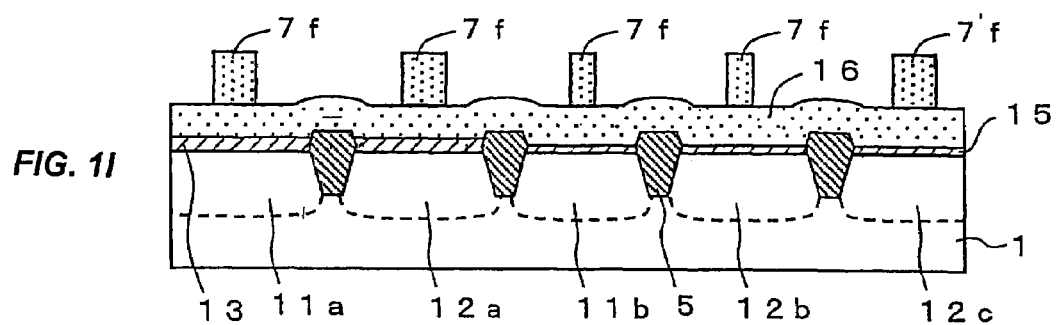
FIG. 1I to FIG. 1K are cross-sectional views illustrating fabrication steps of the semiconductor device according to the first example of the present invention.

As shown in FIG. 1I, a polysilicon layer 16 having a thickness of 150 nm to 300 nm is formed, and a patterned resist layer 7f is formed thereon for the formation of gates. More specifically, a resist is applied to the entire surface of the resultant substrate in a thickness of 2 μm, and then the resist is exposed and developed such that only the resist on gate electrodes are left to form a resist layer 7f. At this time, the gate lengths of the second PMOS transistor (corresponding to reference numeral 12b) and the third PMOS transistor (corresponding to reference numeral 12c) are set to, for example, 180 nm to 220 nm and not smaller than 500 nm, respectively.

Figure 1J:
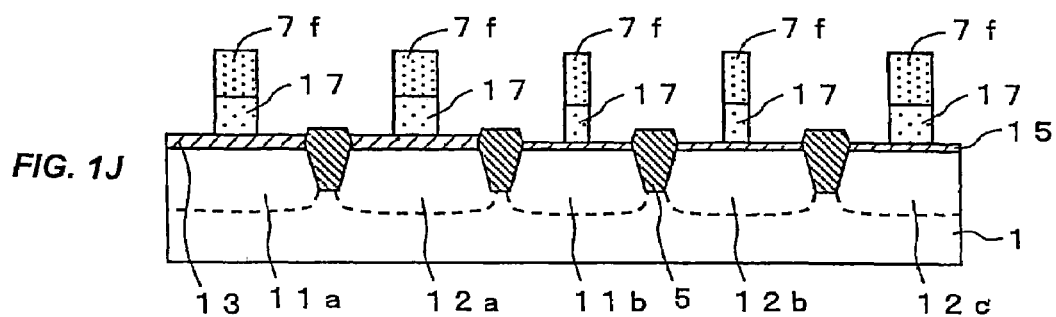

As shown in FIG. 1J, using the resist layer 7f as a mask, the polysilicon layer 16 is anisotropically etched by reactive ion etching to form gate electrodes 17.

Figure 1K:
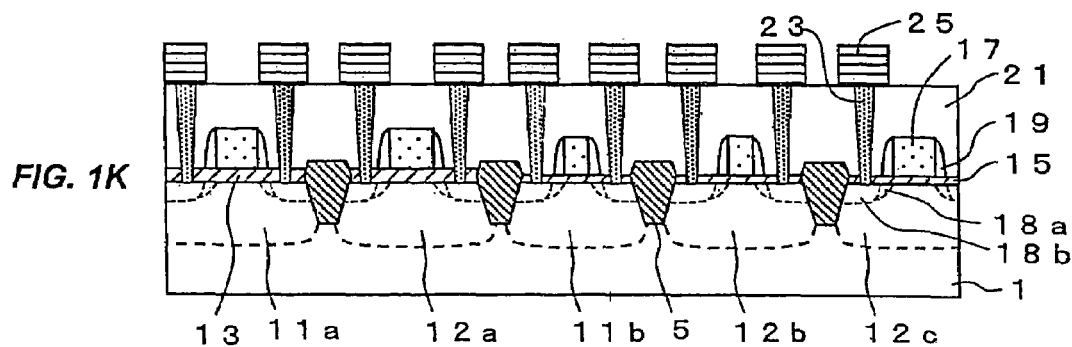

As shown in FIG. 1K, LDD regions 18a, sidewall insulating films 19, source/drain regions 18b, interlayer insulating films 21, contact holes and tungsten plugs 23, and metal interconnections 25 are formed by a well-known technique, whereby a CMOS transistor is fabricated.

The threshold voltages of the thus fabricated first PMOS transistor, second PMOS transistor, and third PMOS transistor are about 0.6 V, about 0.6 V and about 0.1 V, respectively. A PMOS transistor having a low threshold voltage can thus be fabricated without increasing the number of steps.

Though in the above Example, the third PMOS transistor having a low threshold voltage is fabricated, a third NMOS transistor having a low threshold voltage can also be fabricated by a similar method. More specifically, at the time of ion-implantation for forming the first NMOS region 11a and adjusting the threshold voltage shown in FIG. 1B, the same implantation is performed to a third NMOS region. Subsequently, steps similar to the aforementioned steps are performed to form the third NMOS transistor having a low threshold voltage.

What is claimed is:

1. A method for fabricating a semiconductor device comprising on a single semiconductor substrate, a first MOS transistor having a first gate insulating film of a predetermined thickness, and second and third MOS transistors sharing a second gate insulating film smaller in thickness than the first gate insulating film, the first, second and third MOS transistors being of the same conductivity type, the third MOS transistor being lower in threshold voltage than the second MOS transistor, comprising:

adjusting the threshold voltages of the first and third MOS transistors by first ion-implantation; and adjusting the threshold voltage of the second MOS transistor by second ion-implantation, the second ion-implantation being performed under implantation conditions different from those of the first ion-implantation.

2. A method for fabricating a semiconductor device, comprising:

adjusting the threshold voltages of first and third MOS transistors while forming first and third MOS transistor formation regions in a semiconductor substrate by first ion-implantation;

forming a first gate insulating film having a predetermined thickness on the entire surface of the substrate;

adjusting the threshold voltage of a second MOS transistor while forming a second MOS transistor formation region in the substrate by second ion-implantation, the second ion-implantation being performed under different implantation conditions from those of the first ion-implantation;

exposing the substrate by removing a portion of the first gate insulating film above the second and third MOS transistors formation regions; and forming a second gate insulating film on the exposed portion of the substrate so that the second gate insulating film is smaller in thickness than the first gate insulating film, wherein the first, second and third MOS transistors are of the same conductivity type.

3. The method according to claim 1, wherein the threshold voltage of the first MOS transistor is 0.5 V to 0.8 V, and the threshold voltage of the third MOS transistor is 0.05 V to 0.2 V.

4. The method according to claim 2, wherein the threshold voltage of the first MOS transistor is 0.5 V to 0.8 V, and the threshold voltage of the third MOS transistor is 0.05 V to 0.2 V.

5. The method according to claim 1, wherein the third MOS transistor is greater in gate length than the second MOS transistor.

6. The method according to claim 2, wherein the third MOS transistor is greater in gate length than the second MOS transistor.

7. The method according to claim 1, wherein the thickness of the first gate insulating film after the formation of the second gate insulating film is 10 nm to 16 nm, and the thickness of the second gate insulating film is 3 nm to 6 nm.

8. The method according to claim 2, wherein the thickness of the first gate insulating film after the formation of the second gate insulating film is 10 nm to 16 nm, and the thickness of the second gate insulating film is 3 nm to 6 nm.

* * * * *